(12) United States Patent
Connaulte (10) Patent No.: US 10,377,501 B2
(45) Date of Patent: Aug. 13, 2019

(54) THERMOPILE ENERGY STORAGE FOR A ROTARY WING AIRCRAFT

(71) Applicant: AIRBUS HELICOPTERS, Marignane (FR)

(72) Inventor: Matthieu Connaulte, Lancon de Provence (FR)

(73) Assignee: AIRBUS HELICOPTERS, Marignane (FR)

( * ) Notice: Subject to any disclaimer, the term of this patent is extended or adjusted under 35 U.S.C. 154(b) by 596 days.

(21) Appl. No.: 15/221,683

(22) Filed: Jul. 28, 2016

(65) Prior Publication Data
US 2017/0137139 A1    May 18, 2017

(30) Foreign Application Priority Data
Jul. 31, 2015  (FR) .................... 15 01643

(51) Int. Cl.
| | |
|---|---|
| B64D 27/24 | (2006.01) |
| B64C 27/00 | (2006.01) |
| B64D 35/08 | (2006.01) |
| B64D 41/00 | (2006.01) |
| H01M 6/36 | (2006.01) |
| B64C 27/02 | (2006.01) |

(Continued)

(52) U.S. Cl.
CPC ............ *B64D 27/24* (2013.01); *B64C 27/00* (2013.01); *B64C 27/006* (2013.01); *B64C 27/02* (2013.01); *B64C 27/04* (2013.01); *B64D 35/08* (2013.01); *B64D 41/00* (2013.01); *H01L 35/02* (2013.01); *H01L 35/32* (2013.01); *H01M 6/36* (2013.01); *B64D 2027/026* (2013.01); *B64D 2221/00* (2013.01); *H01M 6/50* (2013.01); *Y10S 903/907* (2013.01)

(58) Field of Classification Search
CPC .............................. B64D 27/24; B64C 27/02
See application file for complete search history.

(56) References Cited

U.S. PATENT DOCUMENTS

| | | |
|---|---|---|
| 6,464,750 B1 | 10/2002 | Tailhades et al. |
| 8,464,980 B2 | 6/2013 | Certain |

(Continued)

FOREIGN PATENT DOCUMENTS

| | | |
|---|---|---|
| EP | 1059134 | 12/2000 |
| FR | 2952907 | 5/2011 |

(Continued)

OTHER PUBLICATIONS

Notice of Preliminary Rejection for Korean Application No. 2016-0095759, dated Aug. 21, 2017, 2 Pages.

(Continued)

*Primary Examiner* — Daniel J Cavallari
(74) *Attorney, Agent, or Firm* — Brooks Kushman P.C.

(57) ABSTRACT

A rotary wing aircraft having an electrical installation including at least one thermopile for powering at least one piece of electrical load equipment. Technical specifications for the thermopile specify: a usable power for supplying to the load equipment in the range 20 W to 200 kW, a power rise time lapse lying in the range 3 s to 30 s, and a low operating time for usefully supplying a predetermined quantity of electrical energy lying in the range 10 s to 180 s. The invention applies in particular to rotary wing aircraft.

10 Claims, 1 Drawing Sheet

(51) Int. Cl.
*B64C 27/04* (2006.01)
*H01L 35/02* (2006.01)
*H01L 35/32* (2006.01)
*H01M 6/50* (2006.01)
*B64D 27/02* (2006.01)

(56) References Cited

U.S. PATENT DOCUMENTS

| | | | |
|---|---|---|---|
| 9,008,942 B2 | 4/2015 | Dyrla et al. | |
| 9,045,223 B2 | 6/2015 | Connaulte et al. | |
| 2011/0209739 A1* | 9/2011 | Pingree | H01L 35/32 136/205 |
| 2012/0291425 A1* | 11/2012 | Mitchell | H01L 35/32 60/320 |
| 2013/0219905 A1 | 8/2013 | Marconi et al. | |
| 2015/0047684 A1* | 2/2015 | Mitchell | H01L 35/28 136/201 |

FOREIGN PATENT DOCUMENTS

| | | |
|---|---|---|
| FR | 2994687 | 2/2014 |
| FR | 2997382 | 5/2014 |
| WO | 2012059671 | 5/2012 |

OTHER PUBLICATIONS

French Search Report for French Application No. FR 1501643, Completed by the French Patent Office, dated Jun. 10, 2016, 7 Pages.
Website http://www.asb-group.com/domaine-performance.asp XP 055279373, Dated May 18, 2014, Retrived from the Wayback Machine Aug. 11, 2016, English Machine Translation attached to original, All together 3 Pages, "ABS Group, Performance Area".

* cited by examiner

THERMOPILE ENERGY STORAGE FOR A ROTARY WING AIRCRAFT

CROSS REFERENCE TO RELATED APPLICATION

This application claims priority to French patent application No. FR 15 01643 filed on Jul. 31, 2015, the disclosure of which is incorporated in its entirety by reference herein.

BACKGROUND OF THE INVENTION (1) Field of the Invention

The invention lies in the technical field of electrical installations for rotary wing aircraft. More specifically, the invention relates to storing energy for such electrical installations.

(2) Description of Related Art

A rotary wing aircraft is conventionally provided with at least one main rotor for providing it with lift and possibly also propulsion, and generally with an antitorque tail rotor specifically for opposing the yaw torque exerted by the main rotor of the fuselage of the aircraft and also for controlling yaw movements of the aircraft.

In order to drive the main rotor and the tail rotor in rotation, the aircraft includes a power plant that may include one or more fuel-burning engines.

It should be observed that throughout this text the term "fuel-burning engine" or just "engine" for short is used to cover both turboshaft engines and any piston engine suitable for use in such a power plant. The term "engine" is to be contrasted with the term "electric motor" or just "motor" for short relating to motors driven by electrical power.

Furthermore, in the general field of storing electrical energy, thermopiles are known.

Thus, Document EP 1 059 134 describes thermopiles that are thus used mainly in the aviation and space industries or in emergency safety systems where a reliable backup energy source is required, e.g. in the nuclear, oil, or building industries. Thermopiles are not rechargeable, and prior to being triggered they are inert, thus enabling them to be stored without maintenance, sometimes for as long as 20 years, while remaining usable at any instant with a response time that can sometimes be less than a few tenths of a second. The use of thermopiles is increasing in all fields where there is a need for energy to be available immediately and reliably, even after a storage time that might be very long. Such thermopiles incorporate metal powder, e.g. prepared iron powder, which presents a spongy and filamentary structure. The powder is used in heating compositions for thermopiles.

Various documents propose incorporating one or more energy storage thermopiles in a rotary wing aircraft.

Document FR 2 994 687 describes providing a pilot of a rotary wing aircraft with assistance during a stage of flight in autorotation. The aircraft has a hybrid power plant with a fuel-burning engine, at least one electrical machine, and a main gearbox. By way of example, onboard electrical energy storage may comprise a supercapacitor type capacitor capable of delivering high power for a limited time, a thermopile that requires heat to be delivered in order to supply power, or indeed a rechargeable battery. In flight, the main rotor is driven at a nominal speed of rotation by the hybrid power plant, i.e. a power plant made up of at least one fuel-burning engine and at least one electric motor, such that during an in-flight monitoring step a monitored parameter is measured in order to detect a failure of the engine, if any. When a failure is detected, the electric motor is operated to deliver auxiliary power to the main rotor, thus enabling the pilot to be assisted during flight in autorotation as a result of the failure, thus providing the aircraft with an additional margin for maneuver.

Document FR 2 997 382 describes in-flight control of the operation of fuel-burning engines of a rotary wing aircraft, by means of an electronic engine control unit (EECU) in order to detect an engine failure, if any. An engine is considered to have failed when at least one other engine is being used to deliver power at a contingency rating. The monitoring determines a monitored value of a parameter of the aircraft and a detection threshold for detecting total loss of power. Thereafter, comparing the monitored value with the detection threshold identifies a risk of total loss of power. This loss appears as soon as at least one engine is called on to supply power above a predetermined power level. If a failure is detected with the threshold being crossed, action is taken to ensure that sufficient auxiliary power is supplied to enable the aircraft to be operated safely, e.g. with each engine not delivering power above the predetermined power. For example, the storage means may comprise at least one rechargeable battery, a thermopile, or indeed a supercapacitor.

It can also be advantageous to use one or more thermopiles for the power plants of rotary wing aircraft, such as that described in Document FR 2 952 907. The power plant has a single fuel-burning engine, a main gearbox (MGB) suitable for driving the rotary wing, and a tail gearbox for driving an antitorque rotor. The installation includes a first electric motor mechanically connected to the main gearbox and a second electric motor mechanically connected to the tail gearbox.

Document WO 2012/059671 describes a helicopter having two turboshaft engines and a regulator system. Each of the two turboshaft engines has a gas generator and a free turbine with means suitable for activating the gas generator starting from a super-idle speed. Rotary drive means, gas generator accelerator means, and ignitor means of almost instantaneous effect are provided in the architecture. Those means are in addition to an emergency mechanical assistance device that makes use of an independent onboard energy source. Almost instantaneous ignition is provided as a function of the conditions and stages of flight of the helicopter depending on its mission profile, e.g. during transient conditions or in the event of a failure of the engine in use by reactivating the other engine. For example, when an oversized turboshaft engine that is being used on its own during stages of cruising flight suffers a failure, another engine, which is small, is rapidly reactivated via its emergency assistance device. The electrical equipment connected to the gas generator of this engine starts it and accelerates until its speed of rotation is in an ignition window for the combustion chamber, and then once the combustion chamber has ignited, the gas generator is again accelerated, but in conventional manner. Under super-idle conditions with the combustion chamber extinguished, it is possible to trigger additional ignition of the combustion chamber, i.e. ignition additional to conventional ignition.

Furthermore, Document XP055279373 "ASB—domains de performance des piles Thermiques" [ASB—performance domains of thermopiles] describes a diagram suitable for visualizing the current state of a performance domain of thermopiles. That document describes ranges of values for thermopiles with power going up to 9 kilowatts (kW), with bursts to 25 kW, and specific energy up to 120 watt hours per kilogram (Wh/kg) associated with high discharge rates, a operating duration lying in the range 0.5 seconds (s) to 2 hours (h), and an activation duration starting from 30 milliseconds.

From the above, and with a reasonable thermopile specification, it can be seen that, for improving power plants, it would be useful to make sufficient usable power available for conditions and stages of flight that might occur during certain missions.

In addition, it would be advantageous to use one or more thermopiles for pieces of equipment on board rotary wing aircraft other than power plants, however storing electrical energy is one of the main brakes on electrifying such aircraft.

More generally, the use of electrical energy for rotary wing aircraft provides several advantages, in particular in terms of providing a reserve of energy during certain critical stages of flight such as an engine failure or emergency situations during which maintaining emergency functions increases the safety of the aircraft.

Furthermore, the increasingly strict standards concerning flight safety, pollution emission, and reducing sound nuisance are favorable for this type of energy. Likewise, for onboard equipment such as flight controls, it is more and more frequent to have recourse to electrical devices, for reasons of simplifying design and maintenance, and for reasons of weight and size, in particular.

Consequently, the electrification of rotary wing aircraft incorporating thermopiles is promising.

Nevertheless, batteries are heavy and indeed very heavy if a large quantity of electrical energy needs to be stored, and supercapacitors can supply a large amount of electrical power only over a very limited length of time.

Although thermopiles are for single use only and have a limited operating duration after activation, incorporating them appears to be favorable in certain applications in the field of rotary wing aircraft.

Nevertheless, in practice, several technical problems arise when one or more thermopiles are incorporated in energy storage onboard a rotary wing aircraft.

Thus, incorporating thermopiles in energy storage on board a rotary wing aircraft involves providing thermal protection suitable for keeping such thermopiles in a temperature range that guarantees an optimum supply of energy and in particular of usable energy, while ensuring that structures adjacent to the energy storage of the aircraft do not run the risk of being exposed to excessive heating. For example, composite materials are increasingly present in such aircraft, but they present mechanical properties that are good only below certain temperatures.

For example, thermopiles generally include trigger devices, generally pyrotechnic devices, that are fired electrically when activating them. It is therefore appropriate to control the temperature rises that are due to such devices.

Thus, controlling the temperature of thermopiles must enable thermopiles to be maintained in a relatively limited range of temperatures during each design supply duration, so that appropriate quantities of energy can be made available at the opportune moment.

Furthermore, prior to activation, thermopiles present electrical resistance that is very high, being measured in megohms. However, after activation, thermopiles present tiny resistance that is measured in tenths of an ohm.

In an electric circuit including an energy storage system, it is common practice to use energy converters including filter stages of the capacitive type. When the storage device is put into operation, there is then a large inrush of current for charging the capacitors, and that can damage certain elements in the electrical circuit system, in particular power contactors. It is then appropriate to use a dedicated pre-load circuit comprising a contactor in series with a resistor so as to limit excessive inrush currents. Such additional circuits increase the weight of the onboard electrical equipment, make it more complex, and present a cost that is not negligible. The use of a thermopile makes it possible to avoid the power contactor and the pre-load circuit since current is limited automatically on activation by the internal resistance of the thermopile, which decreases continuously and sufficiently slowly.

A technical problem posed by incorporating thermopiles in rotary wing aircraft is to be able to determine the specifications involving such thermopiles in a manner that is simple, accurate, and without extra cost or extra weight that would be harmful to the aircraft as whole.

Thus, when incorporating thermopiles in a rotary wing aircraft, prior calculation of values for the time it takes to use thermopiles, the duration during which they provide energy, and the power values of such thermopiles is complex but important for determining the advantage of such integration.

BRIEF SUMMARY OF THE INVENTION

It is specified that the invention is not limited to providing emergency power for the power plant, but can also be used to satisfy emergency needs for electrical energy in order to obtain emergency functions in operation in the aircraft.

On the same lines, anticipating the reactivity parameters for thermopiles that are to be incorporated in a rotary wind aircraft is also essential, and these parameters need to be selected accurately as from the design of the aircraft. Thus, for effective incorporation of thermopiles in a rotary wing aircraft, it is necessary to specify accurate time intervals and usable power values.

Furthermore, incorporating thermopiles in a rotary wing aircraft involves determining the time required to detect energy needs that are to be satisfied by such thermopiles, the time required to trigger the thermopiles, the time they require to start supplying sufficient power, and also the response durations of equipment powered by thermopiles. These durations are complex to anticipate accurately since that involves taking a large amount and a wide variety of data into consideration when designing the aircraft, which data is specific to the operation and to the various operating environments of the aircraft.

In this context, whatever the means used for storing electrical energy, the quantity of electrical energy that remains available remains limited, even though the weight of the electrical energy storage means can be large.

As a result, the improvement in performance that might be obtained by using one or more thermopiles within the power plant of an aircraft encounters several limitations specific to thermopiles and also associated with storing electrical energy. For example, it is necessary to find a balance between the improvement in the performance of the electrical installation and the increase in weight generated by using such electrical energy storage means capable of providing the looked-for operation of the aircraft.

For this purpose, the invention provides a method of configuring a rotary wing aircraft, the rotary wing aircraft incorporating an electrical installation and electrical load equipment, the electrical installation including at least one thermopile and being suitable for delivering on demand a predetermined quantity of electrical energy to at least one piece of electrical load equipment.

In an embodiment, the configuration method includes at least a step of defining technical specifications of said at least one thermopile and of the electrical installation, in operational terms, in structural terms, and in terms of arrangement within the rotary wing aircraft, these technical specifications comprising:

a usable power for supplying by said at least one thermopile as a function of the quantity of electrical energy to be delivered by the electrical installation at least for said electrical load equipment, this usable power being predetermined to lie in the range 20 watts (W) to 200 kilowatts (kW);

a power rise time lapse of said at least one thermopile for rising at least to the predetermined quantity of electrical energy, this time lapse lying in the range a few tenths of a second to 3 s;

an availability time during which said electrical load equipment does not require energy but said at least one thermopile remains hot ready for use at any moment, this availability time lying in the range 10 s to 300 s; and an operating time for usable supply of the predetermined quantity of electrical energy from said at least one thermopile at least to said electrical load equipment, this operating time possibly extending up to the availability duration, as a function of the power delivered.

In an embodiment, the step of defining technical specifications includes at least one maximization routine for maximizing the quantity of usable power $P_{load}(t)$ supplied as a function of time t when said at least one thermopile is activated, the maximization routine controlling impedance matching electrical operation of said at least one piece of electrical load equipment, the maximization routine assuming that said at least one thermopile is equivalent, in application of a Thévenin conversion model, to a looped linear electric circuit comprising in series the resistance $R_{pile}$ of the thermopile and the resistance $R_{load}$ of the equipment, with the electromotive force $emf_{pile}$ of the thermopile, with a load electric current $I_{load}(t)$ and a load electric voltage $U_{load}(t)$ of the equipment, such that the maximization routine determines a load voltage value $U_{load}(t)$ that causes the following derivative to be zero:

$$\frac{dP_{load}(t)}{dI_{load}(t)} = emf_{pile} - 2 * R_{pile}(t) * I_{load}(t) = 0$$

such that the load voltage $U_{load}(t)$ is reached when the resistance $R_{load}$ of the equipment is equal to the resistance $R_{pile}$ of the thermopile forming the source. According to the invention, the maximization routine adapts said load voltage $U_{load}(t)$ so as to obtain:

$$U_{load}(t) = \frac{emf_{pile}}{2}$$

In an implementation, the method includes an evaluation rule for use after activation to evaluate the quantity of electrical energy that is available from said at least one thermopile while it is in operation on the basis of the initial energy $E_{initial}$ in the thermopile, the demanded maximum power $P_{max}$, the operating time $T_{operating.max}$ at the power $P_{max}$, e.g. limited as a function of at least one temperature value, as obtained during the step of defining technical specifications, and starting from a measured activation instant $t_{activation}$ for the beginning of activation, from a measured current instant $t_{current}$, and from a measured delivered current power $P_{delivered}(t)$ as measured at the current instant $t_{current}$, such that:

$$P_{delivered}(t)=U_{load}(t_{current})*I_{load}(t_{current})$$

Said rule for evaluating the available quantity of electrical energy during operation of said at least one thermopile provides an energy percentage value T % at the current instant $t_{current}$ from the remaining energy $E_{remaining}$ in said thermopile, the remaining energy $E_{remaining}$ being obtained by differentiating the initial energy $E_{initial}$ in said thermopile, being differentiated from the measured activation instant $t_{activation}$ to the current instant $t_{current}$ for delivered power $P_{delivered}(t)$ at the current instant $t_{current}$, where:

$$P_{delivered}(t)=U_{load}(t_{current})*I_{load}(t_{current})$$

and using the following formula:

$$E_{remaining}=E_{initial}\int_{tactivation}^{t}P_{delivered}(t)dt$$

and then on the basis of the remaining energy $E_{remaining}$, said evaluation rule determines the time remaining at power P "$T_{remaining\ at\ power\ P}$" as a function of the power P, which is the power measured at the current instant $t_{current}$ and as a function of a time at maximum power "$T_{available.max}$", which is specific to said thermopile given its dimensions. Consequently, said evaluation rule calculates the energy value T % using the following formula:

$$T_{remaining\ at\ power\ P} = \frac{E_{remaining}}{P}$$

such that the energy value T % is given by:

$$T\ \% = \frac{T_{remaining\ at\ power\ P}}{T_{available.max}} \times 100$$

In an implementation, the method includes an impedance reduction relationship. The technology of said at least one thermopile is such that on activation, the internal resistance of said thermopile decreases progressively. Particularly, the electrolyte salts progressively become liquid as they heat up, thereby allowing more and more current to flow to the electrical installation. In an implementation, the impedance reduction relationship is executed, e.g. by an electrical control arrangement incorporated in the rotary wing aircraft.

According to the impedance reduction relationship, the electrical control arrangement monitors the internal resistance during the resistance reduction duration that lies in the range 100 milliseconds (ms) to 3 s. The relationship serves to verify that the inrush current to an electronics power converter of the electrical installation is acceptable. Under such circumstances, the installation does not need to have a pre-load resistance for the purpose of limiting the inrush current.

In an implementation, the method includes a temperature monitoring procedure for monitoring the temperature of said at least one thermopile and a temperature protection procedure for keeping said at least one thermopile in a temperature range guaranteeing optimum supply of energy while ensuring that the structures of the rotary wing aircraft adjacent to said at least one thermopile are not exposed to temperatures lying in the range 80° C. to 110° C.

In an implementation, the method is performed for at least one piece of electrical load equipment selected from at least the following list: power plant, in particular having at least one fuel-burning engine; electric motor system of the rotary wing aircraft; safety system of the aircraft; system for assisting the piloting of the aircraft; and an emergency information system for the pilot of the aircraft.

In an implementation, the method is performed for at least one electric motor system for providing a pilot of a rotary wing aircraft with assistance during a stage of flight in autorotation, said electric motor being powered by an electrical energy storage system, said electric motor system being incorporated in a hybrid power plant having said electric motor system and at least one fuel-burning engine, the rotary wing aircraft including a main gearbox, said onboard electrical storage system being electrically connected to said at least one thermopile, the rotary wing aircraft having a main rotor that is driven in flight at a nominal speed of rotation by the hybrid power plant, such that during an in-flight monitoring step at least one monitored parameter is measured in order to detect a failure of the fuel-burning engine if any; such that if a failure is detected, said electrical motor system is operated to deliver auxiliary power for driving the main rotor in rotation, thereby enabling the pilot to be assisted during flight in autorotation following said failure.

As a result, the flight envelope of an aircraft can be extended and the stage of flight in autorotation can be made safe by using the method of the invention, e.g. by enabling the restrictions associated with an aircraft, e.g. a single-engined aircraft, to be reduced.

The invention also provides a rotary wing aircraft suitable for being configured by the above-mentioned method.

In an embodiment, said at least one thermopile is incorporated in the electrical installation of the aircraft and it is housed in at least one compartment for providing protection against thermal radiation and confinement against heat conduction.

In an embodiment, at least one confinement against heat conduction comprises a closed cover on a frame, with at least one heat discharge vent.

In an embodiment, at least one thermopile is dedicated to supplying low power electrical power, such that said usable power lies in the range 20 W to 300 W.

In an embodiment, at least one thermopile is dedicated to supplying high power electrical power, such that usable power lies in the range 50 kW to 200 kW.

In an embodiment, at least one thermopile is dedicated to supplying electrical power for a power plant of the aircraft, such that said usable power lies in the range 5 kW to 25 kW, and in particular for example in the range 10 kW to 20 kW.

BRIEF DESCRIPTION OF THE SEVERAL VIEWS OF THE DRAWINGS

The invention and its advantages appear in greater detail from the context of the following description of embodiments given by way of illustration and with reference to the accompanying figures, in which.

Elements present in more than one of the figures are given the same references in each of them.

DETAILED DESCRIPTION OF THE INVENTION

Figure 1:
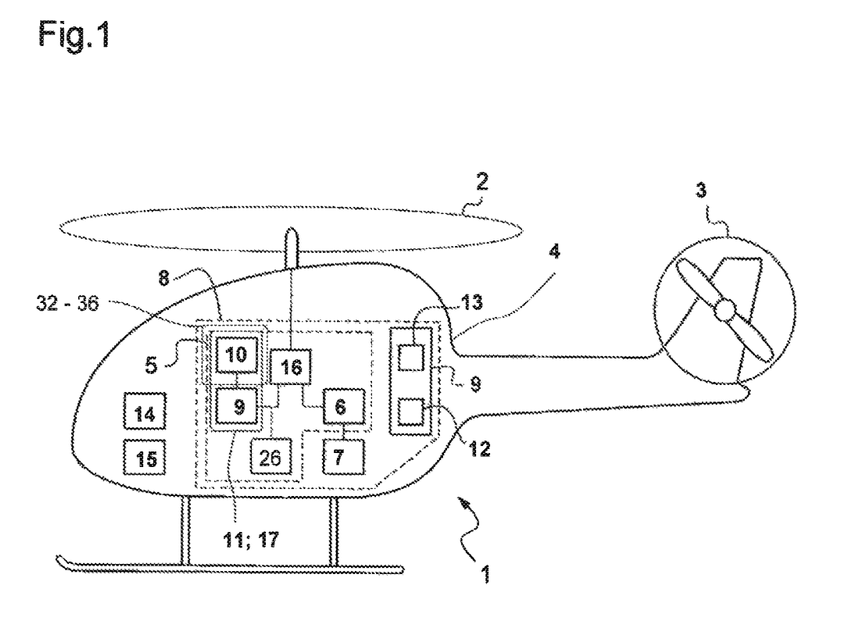
FIG. 1 shows an aircraft of the invention.

FIG. 1 shows a rotary wing aircraft 1 of the invention.

A rotary wing aircraft 1 is provided with at least one main rotor 2 for providing it with lift and possibly also propulsion, and for a helicopter there is generally also a tail rotor 3 serving in particular to oppose the yaw torque exerted by the main rotor 2 on the fuselage 4 of the aircraft 1, and also serving to control yaw movements of the aircraft 1. For hybrid rotary wing aircraft 1, instead of a tail rotor, the aircraft 1 of the invention has fixed wings carrying at least one pair of propellers that may replace an antitorque tail rotor.

In order to drive the main rotor 2 in rotation, and possibly also the tail rotor and/or the propellers, the aircraft has a power plant 5 that may have one or more fuel-burning engines 6, fed with fuel from a tank 7.

It should be understood that the term "fuel-burning engine" or just "engine" for short covers both turboshaft engines and piston engines suitable for use in such a power plant 5, in contrast to the term "electric motor" or just "motor" for short which is used for motors that are given by electrical power.

In FIG. 1, the rotary wing aircraft 1 incorporates an electrical installation 8 with electricity-consuming load equipment 9. In accordance with the invention, the electrical installation 8 includes at least one thermopile 10 that is suitable for delivering a predetermined quantity of electrical energy on demand to at least one piece of electrical load equipment 9.

Depending on the embodiment, the electrical load equipment 9 constitutes all or part of: electric motor means 11 of the power plant 5; an onboard safety system 12; a system 13 for providing assistance in piloting the aircraft 1; and an emergency information system 14 for the pilot of the aircraft, including a man/machine interface 15, typically with a visual display and emitters of sound signals.

In particular in an embodiment in which at least one piece of electrical load equipment 9 is for being powered by at least one thermopile 10, at least one piece of electrical load equipment 9 is constituted by all or part of a power plant 5 having one or more fuel-burning engines, with one or more components of these engines forming said electrical load equipment 9.

In FIG. 1, it can be seen that the electric motor means 11 and the engine(s) 6 of the power plant 5 are mechanically connected to a main gearbox (MGB) given reference 16.

Thus, one or more thermopiles 10 form a portion of an electrical energy storage system 17 that itself forms a portion of the electrical installation 8. The invention proposes using storage systems that are limited in number of utilization cycles (one to 100 charge/discharge cycles), and in particular systems for single use (not rechargeable). Systems 17 of this type fully satisfy the unusual situation of providing additional power during critical stages such as a failure of a main engine of the aircraft 1. These systems 17 are optimized for delivering a high rate of discharge: i.e. very high power for a short length of time.

Put briefly, a thermopile 10 is a non-rechargeable battery for single use only that is totally inert before being activated. By way of example, it may be a lithium thermopile that produces energy from a reactive electrochemical couple.

Its operation is based on activating cells, themselves made by compressing powder, each having an anode, an electrolyte, and a cathode, together with a heater pellet and a separator. The electrolyte, which constitutes the separator medium between the anode and the cathode, is generally solid. The assembly made up of these cells is inert throughout the period during which the thermopile 10 is stored.

For each thermopile 10, the necessary number of cells is stacked in order to obtain the required voltage. On activation, trigger columns deliver heat to the cells so that their temperature rises, the electrolyte melts, and ions can be exchanged: power is thus made available from the thermopile 10. After being collected, the electricity is transmitted through a wire-guide that passes the electrical signal to the outside.

Known advantages of thermopiles 10 include constituting a reserve source of energy that can be stored for several years and that can be made available immediately. Thermopiles 10 are inert throughout their storage time, being completely sealed and capable of withstanding severe environments.

Thermopiles 10 can be activated in a few tenths of a second, even after being stored for years. Thermopiles 10 are adapted to particular needs and they offer an advantageous specific power ratio (in watts per kilogram). Thermopiles 10 are classified as non-explosive equipment by NATO and they are not pyrotechnic.

Thermopiles 10 may be coupled in conventional manner with other elements within an electrical installation, and in particular with sensors, and conventional batteries, in particular for safety applications.

Figure 2:
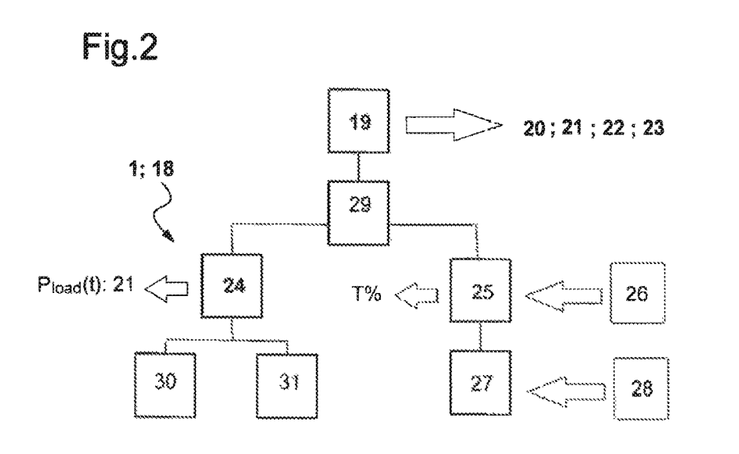
FIG. 2 is a block diagram of the method of the invention.

With reference to FIG. 2, there follows a description of a configuration method 18. The configuration method 18 applies to a rotary wing aircraft 1 such as that shown in FIG. 1.

In an implementation, the method 18 includes at least a step 19 of defining technical specifications 10 of said at least one thermopile 10 and of the electrical installation 8, in operational terms, in structural terms, and in terms of their arrangements within the aircraft 1.

In particular, these specifications 20 comprise:

usable power 21 to be delivered by said at least one thermopile 10 as a function of the quantity of electrical energy to be delivered by the electrical installation 8 at least for said electrical load equipment 9, said usable power 21 being predetermined and lying in the range 20 W to 200 kW;

a power rise time lapse 22 for said at least one thermopile 10, at least up to the predetermined quantity of electrical energy, this time lapse 22 lying in the range 3 s to 30 s;

a low operating time 23 during which the predetermined quantity of electrical energy can be delivered at least to said electrical load equipment 9 by said thermopile 10, this low time 23 lying in the range 10 s to 180 s;

an availability time $t_{availability}$ during which said electrical load equipment 9 does not require energy, but said at least one thermopile 10 remains hot ready for use at any moment, which availability time lies in the range 10 s to 300 s; and an operating time during which the predetermined quantity of electrical energy can usefully be delivered at least to said electrical load equipment 9 by said at least one thermopile 10, this operating time possibly being as long as the availability duration, as a function of the delivered power.

Specifically, the operating time may be as long as the availability duration, since when little power is used energy remains available that has been produced by said at least one thermopile 10 and that has been stored in the electrical installation 8, even though said at least one thermopile 10 is cold, i.e. inoperative after being used. For example, there may remain a value of only 30 seconds at maximum power $P_{max}$. Typically, a thermopile 10 is heated to 600° C., for example, and then given its thermal lagging it cools down until it loses the capacity of its thermal inertia.

For example, the usable power 21 is determined as a function of the weight of the aircraft 1 and of its missions.

It may be observed that if consideration is given to powering an associated emergency information system 14, the power required by the system 14 is only a few watts.

Examples of pieces of electrical load equipment 9 include in particular the electric motor means 11 of the power plant 5. Typically, such electric motor means 11 require high power, particularly in the range 50 kW to 200 kW.

In an embodiment, at least one thermopile 10 is dedicated to delivering electrical power to the power plant 5 of the aircraft 1, such that said usable power may, by way of example, lie in the range 5 kW to 25 kW, and in particular in the range 10 kW to 20 kW.

By way of example, the power delivered to a gas generator may come from one or more thermopiles 10. Thus, the use of at least one thermopile 10 may be advantageous in a power plant 5 and for a gas generator of an internal combustion turbine.

In embodiments, this makes it possible to use at least one thermopile 10, in particular when rapidly restarting a turbine that is idle or super-idle, when supplying power to the power plant 5 with an engine that is operating at a transient high power rating such as a rating of the one-engine inoperative (OEI) type for multi-engined aircraft 1, or indeed during a stage requiring a sudden increase of power.

Other examples of electrical load equipment 9 include in particular the onboard safety system 12, and in particular emergency lighting (e.g. using 28 volts (V) at 2 amps (A)) which requires low power, typically of the order of 50 W, e.g. for 600 s. Thermopiles of the invention may be used, where necessary, to power an emergency horizon and/or to light it, likewise requiring low power, in particular of the order of 50 W.

Other examples of pieces of electrical load equipment 9 include in particular the system 13 for providing assistance that is necessary for flying and landing safely, including emergency radionavigation (secondary horizon, rotor rotation rate, altitude, air speed, etc.) that, in low power installations, need about 200 W to 300 W, and emergency radiocommunication, requiring that one or more thermopile(s) 10 deliver(s) electrical power of the order of 100 W to 200 W, depending on the embodiment, and for a short duration.

In an embodiment of the invention, the rotary wing aircraft 1 has at least one thermopile 10 that is dedicated to supplying low power electrical power, such that said usable power 21 lies in the range 20 W to 300 W. An embodiment of the invention provides for the aircraft 1 to have at least one thermopile 10 that is dedicated to delivering high power electrical power, such that said usable power 21 then lies in the range 50 kW to 200 kW.

In the implementation of FIG. 2, the definition step 19, and thus the method 18, includes at least one maximization routine 24 for maximizing the quantity of usable power $P_{load}(t)$ that is delivered as a function of time t, i.e. the power 21, on activating said at least one thermopile 10. This routine 24 causes at least one piece of electrical load equipment 9 to operate electrically with impedance adaptation.

It can be understood that the maximization routine 24 is prepared while configuring the aircraft 1 and that it is executed while the aircraft 1 is in operation, when said at least one thermopile 10 is used.

This maximization routine 24 seeks to deliver the greatest quantity of energy possible as quickly as possible, e.g. to the electric motor means and thus to the aircraft 1 in order to limit the loss of power resulting from an engine failure, and thus improves pilotability and flight safety.

Under such circumstances, the routine 24 assumes that said thermopile 10 is equivalent, using a Thévenin conversion model, to a looped linear electric circuit having in series the resistance $R_{pile}$ of the thermopile 10 and the resistance $R_{load}$ of the equipment, with the electromotive force $emf_{pile}$ of the thermopile 10, with a load current $I_{load}(t)$, and with a load voltage $U_{load}(t)$ of the equipment 9.

Consequently, this routine 24 determines a value for the load voltage $U_{load}(t)$ for which the following derivative is zero, i.e. it applies the equation:

$$\frac{dP_{load}(t)}{dI_{load}(t)} = emf_{pile} - 2 * R_{pile}(t) * I_{load}(t) = 0$$

As a result, the load voltage $U_{load}(t)$ is reached when the resistance $R_{load}$ of the equipment 9 is equal to the resistance $R_{pile}$ of the thermopile 10 constituting the source of said circuit.

In this example of the routine 24, maximization adapts said load voltage $U_{load}(t)$ so as to obtain:

$$U_{load}(t) = \frac{emf_{pile}}{2}$$

In the implementation of FIG. 2, the aircraft 1 has an electrical control arrangement 28. In an embodiment, this arrangement 28 includes a device for triggering said at least one thermopile 10.

For example, the trigger device comprises at least one mechanical ignitor that is sensitive to the aircraft 1 accelerating by a value that is greater than its trigger value. When the trigger threshold is reached, the trigger device automatically activates said at least one thermopile 10.

In another embodiment, the trigger device comprises at least one gyro, e.g. of the microelectromechanical system (MEMS) type that is sensitive to accelerations of the aircraft 1 that are greater than a trigger threshold value.

Yet another embodiment provides for the trigger device to comprise at least one voltage loss trigger that is responsive to an electrical voltage below a threshold voltage value in the electrical installation. When this threshold voltage value is reached, the trigger device automatically causes said at least one thermopile 10 to be activated.

In the implementation of FIG. 2, the method 18 has an evaluation rule 25 for evaluating the quantity of electrical energy available after activation.

It can be understood that the evaluation rule 25 is prepared while configuring the aircraft 1 and it is executed while the aircraft 1 is in operation, when said at least one thermopile 10 is used.

It gives the quantity of electrical energy available after activation of said at least one thermopile 10 of the system 17.

During the operation of said at least one thermopile 10, the following real time flight parameters of the aircraft 1 are measured, e.g. by a measurement device 26:
  initial energy in the thermopile 10: $E_{initial}$;
  maximum demanded power $P_{max}$;
  the available time $T_{available.max}$ at this maximum demanded power $P_{max}$;
  the operating time $T_{operating.max}$, limited by a value e.g. of at least one temperature sensor of the device 26, which are obtained during the step 19 of defining technical specifications; and
on the basis of:
  a measured activation instant $t_{activation}$ of the beginning of activation;
  a measured current instant $t_{current}$; and
  a delivered current power $P_{delivered}(t)$ measured at the current instant $t_{current}$, such that:

$$P_{delivered}(t) = U_{load}(t_{current}) * I_{load}(t_{current}); \text{ and}$$

the evaluation rule 26 provides an energy percentage value T % calculated as follows. Said rule for evaluating the available quantity of electrical energy during operation of said at least one thermopile supplies an energy percentage value T % at the current instant $t_{current}$ on the basis of the energy $E_{remaining}$ that remains in the thermopile. This remaining energy $E_{remaining}$ is obtained by differentiating the initial energy $E_{initial}$ in the thermopile differentiated from the measured activation instant $t_{activation}$ to the current instant $t_{current}$ for a delivered power $P_{delivered}(t)$ at said current instant $t_{current}$, where:

$$P_{delivered}(t) U_{load}(t_{current}) * I_{load}(t_{current})$$

and by using the following formula:

$$E_{remaining} = E_{initial} \int_{tactivation}^{t} P_{delivered}(t) dt$$

Thereafter, on the basis of the remaining energy $E_{remaining}$, said evaluation rule determines the time "$T_{remaining\ at\ power\ P}$" as a function of the power P, which is the power measured at the current instant $t_{current}$, and as a function of a time "$T_{available.max}$" at maximum power, which is specific to said at least one thermopile 10 given its dimensions. Under such circumstances, said evaluation rule 25 calculates the energy value T % using the following formula:

$$T_{remaining\ at\ power\ P} = \frac{E_{remaining}}{P}$$

such that the energy value T % is:

$$T\% = \frac{T_{remaining\ at\ power\ P}}{T_{available.max}} \times 100$$

Depending on the embodiment, and by way of example, the power P is the delivered current power $P_{delivered}(t)$ or the demanded maximum power $P_{max}$.

It can be understood that such a value T % is useful for piloting the aircraft 1 and may typically be supplied, e.g. by means of a display on the man/machine interface 15, either on request and/or in the event of an emergency situation being detected.

It can be understood that T % may be calculated for any power value P, with the time remaining at full power being limited by the availability duration. In examples, an advantageous value for T % is obtained when the power under consideration is $P_{max}$.

In embodiments of the aircraft 1, at least some of the data and values produced by the method of the invention is brought to the attention of the pilots of the aircraft, typically via the man/machine interface (MMI) 15. For example, the value T % is displayed visually on the interface 15, e.g. on a dial, using indicator lamps in proportion to a value, or using at least one display having multiple colors, the colors being dedicated to respective values.

In the implementation of FIG. 2, the method 18 also includes a relationship 27 for reducing impedance. The technology of said at least one thermopile 10 is such that on activation the internal resistance of said at least one thermopile 10 decreases progressively. Specifically, the electrolyte salts progressively become liquid on being heated and thus allow an ever-increasing electric current to flow.

In an implementation, the impedance reduction relationship 27 is executed, e.g. by an electrical control arrangement 28 (FIG. 2) incorporated in the aircraft 1.

It can be understood that the impedance reduction relationship 27 is prepared while configuring the aircraft 1 and that it is executed while the aircraft 1 is in operation, when said at least one thermopile 10 is in use.

In this impedance reduction relationship 27, the electrical control arrangement 28 monitors the internal resistance over the time required for resistance to decrease, which generally lies in the range 100 ms to 3 s. This relationship 27 serves to verify that the inrush current of power conversion electronics of the electrical installation 8 is acceptable. Under such circumstances, the electrical installation 8 does not have a pre-load resistance for limiting this inrush current.

In the implementation of FIG. 2, the method 18 includes a temperature monitoring procedure 30 for monitoring the temperature of said at least one thermopile 10, and a temperature protection procedure 31 for keeping said thermopile 10 in a predetermined temperature range. This range is predetermined so as to guarantee optimum delivery of electrical energy, while ensuring that structures of the aircraft 1 adjacent to the thermopile 10 are not exposed to unacceptable or even damaging heating.

It can be understood that these procedures 30 and 31 are prepared while configuring the aircraft 1 and that they are executed while the aircraft 1 is in operation, when said at least one thermopile 10 is used.

The predetermined temperature range may extend from 80° C. to 110° C., in the example of FIG. 2.

It can be seen that it is the technology of the thermopile(s) 10 that determines how much heat is delivered. This may be determined in such a manner that the core of the thermopile is heated to a temperature of up to 600° C.

This heating takes place quickly. Thereafter, the thermopile cools down naturally (conduction/radiation). Below 450° C., the thermopile ceases to operate since the salts have become solid once more. The thermal lagging of the thermopile makes it possible to maintain its core temperature as long as possible, and also to limit the temperature on the surface of the thermopile. It is also possible to put the thermopile in an additional container serving to isolate the thermopile from its surroundings and guide any gas given off during failure to the outside of the aircraft, as described below.

Furthermore, in the example of FIG. 1, said at least one thermopile 10 is incorporated in the electrical installation 8 with at least one protective compartment 32 providing protection against heat radiation as produced by said at least one thermopile 10 and/or confinement 33 against heat conduction. In this embodiment, the confinement 33 against conduction comprises a closed cover 34 arranged on an insulating frame 35 with at least one heat discharge vent 36.

Typically, the compartment 32 serves to limit the impact of the temperature of each thermopile 10 on the other pieces of equipment in the installation 8.

Furthermore, in an example, the vent 36 in the closed cover 34 performs two functions, specifically:
- connecting the thermopile 10 to the outside air in order to limit the temperatures seen by an ignitor for actuating each thermopile 10, typically in the range 80° C. to 110° C., temperatures at which the ignitor becomes degraded; and
- discharging gas resulting from poor operation of each thermopile 10 inside the cover 34.

In an implementation, the method 18 is performed for at least one piece of electrical load equipment 9 selected at least from the following list: electric motor means of the rotary wing aircraft 1; a safety system of the aircraft 1 (e.g. emergency power supply for electrical flight controls); a system for providing assistance in piloting the aircraft 1; and an emergency information system for the pilot of the aircraft 1 (e.g. emergency lighting, emergency horizon and radio-communication and radionavigation equipment necessary for survival in the event of a loss of electricity generation).

In the implementation of FIG. 2, the method 18 is performed by at least one electric motor system for assisting a pilot of the rotary wing aircraft 1 during a stage of flight in autorotation. For example, the teaching of above-mentioned Document FR 2 994 687 may be combined with the invention by incorporating one or more thermopiles 10 in the electrical installation 8.

Consequently, said electric motor system 11 is powered by an electrical energy storage system 17. The electric motor system 11 is then integrated in the power plant 5 of hybrid type together with at least one fuel-burning engine 6.

In FIG. 2, the method 18 includes an in-flight monitoring step 29 during which at least one monitored parameter is measured, e.g. via the measurement device 26 in order to detect a failure of the engine 6, if any.

When a failure is detected, the electric motor system 11 is operated either manually or automatically in order to deliver auxiliary power for driving the main rotor 2 in rotation. This auxiliary power serves to assist the pilot during flight in autorotation following the failure.

As a result, the flight envelope of the aircraft 1 can be extended and the stage of autorotation flight takes place by using the method 18 of the invention, e.g. by enabling the restriction associated with a single-engined aircraft 1 to be reduced.

Naturally, the present invention may be subjected to numerous variations as its implementation. Although several implementations are described, it will readily be understood that it is not conceivable to identify exhaustively all possible implementations. It is naturally possible to envisage replacing any of the means described by equivalent means without going beyond the ambit of the present invention.

LIST OF NUMERICAL REFERENCES 1 rotary wing aircraft 1
2 main rotor 2
3 tail rotor 3 or propellers
4 fuselage 4
5 power plant 5
6 fuel-burning engine 6
7 fuel tank 7
8 electrical installation 8
9 electrical load equipment 9
10 thermopile 10
11 electric motor system 11
12 safety system 12
13 system 13 for providing assistance in piloting
14 emergency information system 14 for the pilot
15 man/machine interface 15
16 main gearbox 16
17 energy storage system 17
18 configuration method 18
19 definition step 19
20 technical specifications 20
21 usable power 21
22 time lapse 22

23 low operating time 23
24 maximization routine 24
25 evaluation rule 25
26 measurement device 26
27 impedance reducing relationship 27
28 electrical control arrangement 28
29 monitoring step 29
30 temperature monitoring procedure 30
31 temperature protection procedure 31
32 protective compartment 32
33 confinement 33 against heat conduction
34 closed cover 34
35 insulating frame 35
36 heat discharge vent 36

What is claimed is:

1. A method of configuring a rotary wing aircraft, the rotary wing aircraft incorporating an electrical installation and electrical load equipment, the electrical installation including at least one thermopile and being suitable for delivering on demand a predetermined quantity of electrical energy to at least one piece of electrical load equipment, the method comprising at least a step of powering the electrical installation and the pieces of electrical load equipment in compliance with a definition of technical specifications for the at least one thermopile and for the electrical installation in operational terms, in structural terms, and in terms of arrangement within the aircraft, the step of supplying power in compliance with the technical specifications comprising:

a usable power for supplying by the at least one thermopile as a function of the quantity of electrical energy to be delivered by the electrical installation at least for the electrical load equipment;

a power rise time lapse of the at least one thermopile for rising at least to the predetermined quantity of electrical energy;

a low operating time during which the predetermined quantity of electrical energy can be supplied usefully by the at least one thermopile at least to the electrical load equipment; and an availability time $t_{availability}$ during which the electrical load equipment does not require energy but the at least one thermopile remains hot ready for use at any moment;

wherein the usable power is predetermined in the range 20 W to 200 kW, the power rise time lapse lies in the range 3 s to 30 s, the low operating time for useful supply lies in the range 10 s to 180 s, and the availability time $t_{availability}$ lies in the range 10 s to 300 s; and wherein the step of supplying power in compliance with the definition of the technical specifications includes at least one maximization routine for maximizing the quantity of usable power $P_{load}(t)$ supplied as a function of time t when the at least one thermopile is activated, the maximization routine controlling impedance matching electrical operation of the at least one piece of electrical load equipment, the maximization routine assuming that the at least one thermopile is equivalent, in application of a Thévenin conversion model, to a looped linear electric circuit comprising in series the resistance $R_{pile}$ of the thermopile and the resistance $R_{load}$ of the equipment, with the electromotive force $emf_{pile}$ of the thermopile, a load electric current $I_{load}(t)$ and a load electric voltage $U_{load}(t)$ of the equipment, such that the maximization routine determines a load voltage value $U_{load}(t)$ that causes the following derivative to be zero:

$$\frac{dP_{load}(t)}{dI_{load}(t)} = emf_{pile} - 2 * R_{pile}(t) * I_{load}(t) = 0$$

the load voltage $U_{load}(t)$ being replaced when the resistance $R_{load}$ of the equipment is equal to the resistance $R_{pile}$ of the thermopile forming the source, such that the maximization routine adapts the load voltage $U_{load}(t)$ so as to obtain:

$$U_{load}(t) = \frac{emf_{pile}}{2}$$

2. A method according to claim 1, wherein the method includes a post-activation evaluation rule for evaluating the quantity of electrical energy available from the at least one thermopile while it is in operation, the evaluation rule supplying an energy percentage value T % at the current instant $t_{current}$ from the remaining energy $E_{remaining}$ in the thermopile, the remaining energy $E_{remaining}$ being obtained by differentiating the initial energy $E_{initial}$ in the thermopile, being differentiated from the measured activation instant $t_{activation}$ to the current instant $t_{current}$ for delivered power $P_{delivered}(t)$ at the current instant $t_{current}$, where:

$$P_{delivered}(t) = U_{load}(t_{current}) * I_{load}(t_{current})$$

and using the following formula:

$$E_{remaining} = E_{initial} \int_{t_{activation}}^{t} P_{delivered}(t) dt$$

and then on the basis of the remaining energy $E_{remaining}$, the evaluation rule determines the time remaining at power P "$T_{remaining\ at\ power\ P}$" as a function of the power P, which is the power measured at the current instant $t_{current}$ and as a function of a time at maximum power "$T_{available.max}$" which is specific to the thermopile given its dimensions, the evaluation rule calculates the energy value T % using the following formula:

$$T_{remaining\ at\ power\ P} = \frac{E_{remaining}}{P}$$

such that the energy value T % is given by:

$$T\% = \frac{T_{remaining\ at\ power\ P}}{T_{available.max}} \times 100$$

3. A method according to claim 1, wherein the method includes an impedance reduction such that of the at least one thermopile the internal resistance of the thermopile, which diminishes progressively, is monitored during the duration of resistance reduction, which lies in the range 100 ms to 3 s, the impedance reduction relationship verifying that the inrush current of power converter electronics of the electrical installation is acceptable, such that the electrical installation does not include a pre-load resistance for the purpose of limiting the inrush current.

4. A method according to claim 1, wherein the method includes monitoring the temperature of the at least one thermopile and a temperature protection procedure for keeping the at least one thermopile in a temperature range guaranteeing optimum supply of energy while ensuring that the structures of the aircraft adjacent to the at least one thermopile are not exposed to temperatures lying in the range 80° C. to 110° C.

5. A method according to claim 1, wherein the method is implemented for at least one piece of electrical load equipment selected at least from the following list: power plant; electric motor system of the aircraft; safety system of the aircraft; system for assisting the piloting of the aircraft; and an emergency information system for the pilot of the aircraft.

6. A method according to claim 5, wherein the method is performed for at least one assistance electric motor system for providing a pilot of a rotary wing aircraft with assistance during a stage of flight in autorotation, the electric motor system being powered by an electrical energy storage system, the assistance electric motor system being incorporated in a hybrid power plant having the electric motor system and at least one fuel-burning engine, the aircraft including a main gearbox, the electrical energy storage system being on-board and electrically connected to the at least one thermopile, the rotary wing aircraft having a main rotor that is driven in flight at a nominal speed of rotation by the hybrid power plant, such that during an in-flight monitoring step at least one monitored parameter is measured in order to detect a failure of the fuel-burning engine if any; such that if a failure is detected, the electrical motor system is operated to deliver auxiliary power for driving the main rotor in rotation, thereby enabling the pilot to be assisted during flight in autorotation following the failure.

7. A rotary wing aircraft configured using the method of claim 1, wherein the at least one thermopile incorporated in the electrical installation is housed in at least one protective compartment for providing protection against thermal radiation and for providing confinement against heat conduction, and that at least one confinement against heat conduction comprises a closed cover on a frame, with at least one heat discharge vent.

8. A rotary wing aircraft according to claim 7, wherein at least one thermopile is dedicated to supplying low power electrical power, such that the usable power lies in the range 20 W to 300 W.

9. A rotary wing aircraft according to claim 7, wherein at least one thermopile is dedicated to supply high power electrical power, such that usable power lies in the range 50 kW to 200 kW.

10. A rotary wing aircraft according to claim 7, wherein at least one thermopile is dedicated to supplying electrical power for a power plant of the aircraft, such that the usable power lies in the range 5 kW to 25 kW, and for example in the range 10 kW to 20 kW.

* * * * *